May 6, 1969 W. C. CROUCHER ET AL 3,442,587

MATCH STEPPING CAMERA AND METHOD FOR MATCHING REGISTRATION AND REDUCTION OF STEPPED PHOTOGRAPHIC IMAGES TO EXISTING PATTERNS ON SEMICONDUCTORS

Filed Dec. 6, 1965

INVENTORS
WILLIAM C. CROUCHER
WILLIS F. ESTEP
GILBERT H. ROSS
BY
Sheridan and Ross
ATTORNEYS United States Patent Office 3,442,587

Patented May 6, 1969

3,442,587

MATCH STEPPING CAMERA AND METHOD FOR MATCHING REGISTRATION AND REDUCTION OF STEPPED PHOTOGRAPHIC IMAGES TO EXISTING PATTERNS ON SEMICONDUCTORS

William C. Croucher, Englewood, and Willis F. Estep and Gilbert H. Ross, Denver, Colo., assignors to Martin-Marietta Corporation, New York, N.Y., a corporation of Maryland Filed Dec. 6, 1965, Ser. No. 511,691

Int. Cl. G03b 27/44

U.S. Cl. 355—54 12 Claims

ABSTRACT OF THE DISCLOSURE

An apparatus and method for making a high resolution photographic plate which is subsequently used in producing a mask used in the vapor deposit process for formulation of multiple circuit patterns in a prearranged array upon an undiced semi-conductor substrate. A common mounting member is provided for mounting a photosensitive plate and a reference member carrying reference indicia. A negative bearing an image of a circuit pattern is supported in spaced relationship to the plate. A microscope is mounted so that its reticle can be aligned with one of the reference indicia on the reference member. This alignment effects the proper alignment between the image on the negative and the photosensitive plate. The plate is then exposed to the image to form a first latent image. The common support is then adjusted until the reticle of the microscope is aligned with second reference indicia which simultaneously accurately aligns the image and the plate to form a second latent image on the plate. A plotting mechanism including a pantograph linkage is connected to the common mounting member so that an operator can keep track of the location and number of latent images formed on the plate.

Figure 1:
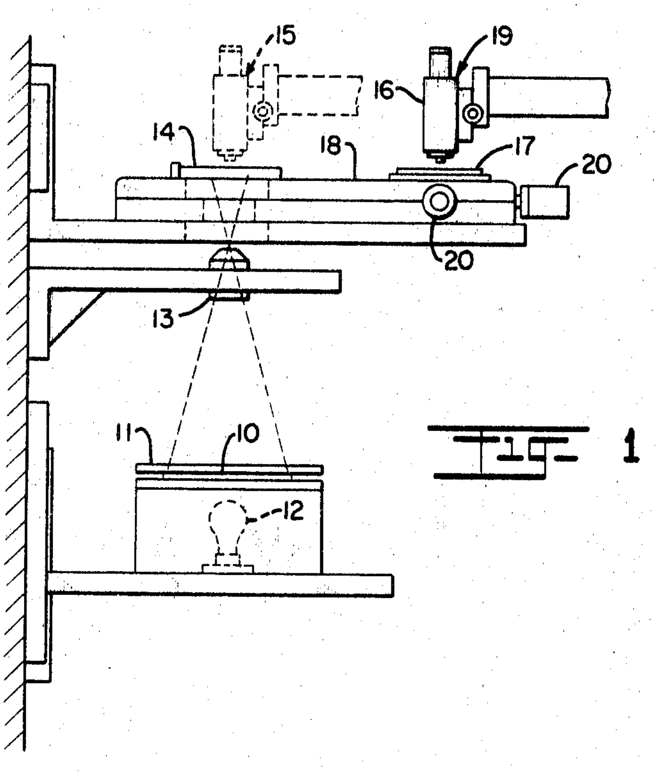

This invention relates to a method and apparatus for making photographic masks for semiconductor substrates, such as silicon wafers, prepared with prediffused geometries of components or elements, such as transistors and diodes, for the production of microcircuit patterns used in the fabrication of integrated circuits.

The photographic masks referred to are used in vacuum-metalizing techniques, for example, to deposit resistors, capacitors, interconnections and other so-called passive circuit components, elements or parts, upon the semiconductor wafer in multiple array, before dicing the wafer, to finally produce microcircuit units or chips. The problem of fabricating such masks is complicated by the difficulty of achieving the precise registration required between mask and semiconductor wafer. In other words, the photographic masks are required to contain discretely multiple microcircuit patterns arrayed in the desired deposition pattern or configuration to match the geometry built in to the wafer or substrate.

In the fabrication of hybrid solid state thin film microcircuits, active components or elements, such as, transistors and diodes, are prediffused or formed in predetermined patterns in semiconductor wafers or substrates of certain elements, such as silicon or germanium, and usually silicon. The true positions of ohmic contacts are precisely measured on the undiced wafer containing the predetermined patterns. The microcircuit array of multiple microcircuit patterns to be applied to the surface of the undiced wafer is then laid out in art work at several hundred times magnification on a coordinatograph. The resulting layout or art work is reduced, usually to about one-twentieth its size, such as onto a glass photographic plate. Intermediate plates are contact reversed to produce negative images. These intermediate, negative image plates or replicas to be copied, are mounted on the objective stage of the match stepping camera used in the method and apparatus of the present invention. A final reduction of about one-tenth in size of the intermediate plate negative image is produced and photographically repeated fifty to one hundred times on a high resolution glass photographic plate. The resulting high resolution plates are used to make the desired metal masks for use in subsequent evaporation or vapor deposition processes to produce the desired multiple microcircuits on the semiconductor wafer or substrate. This involves a photoresist masking procedure including either etching away unwanted films, or reverse masking and dissolving away the mask under unwanted films.

Among the problems encountered in this thin film microcircuit process for making integrated circuits is that of matching each stepped photographic image, of about one hundred such images, on a two-inch square, high resolution glass photographic plate, so that each stepped image matches within about ±0.1 mil the positions of the transistors, diodes, or other elements already formed or built structurally and geometrically into the semiconductor wafer or wafers serving as the substrate of the microcircuits to be fabricated thereon.

Accordingly, it is a primary object of this invention to provide a method and apparatus for match stepping photographic images of art work, in a series of such images in the form of a predetermined array thereof, in precise relation to a replica or master pattern.

Additional objects of the invention will become apparent from the following description, which is given primarily for purposes of illustration, and not limitation.

Stated in general terms, the objects of the invention are attained by making a photographic mask for the semiconductor substrate, such as a silicon wafer, by projecting an image of previously prepared art work to a photographic plate on a platform. The silicon wafer or a replica thereof is attached to the platform at a position spaced from the plate. Using a micromanipulator, each of the microcircuit patterns in the array of a large number of such circuit patterns, is aligned under a microscope by sighting-in directly on reference marks on the wafer replica instead of indirectly stepping off equal increments in accordance with prior art methods. The microcircuits produced on the wafer or substrate from the mask thus registered directly are more precisely aligned than those produced using masks made by indirectly stepping off equal increments.

Figure 2:
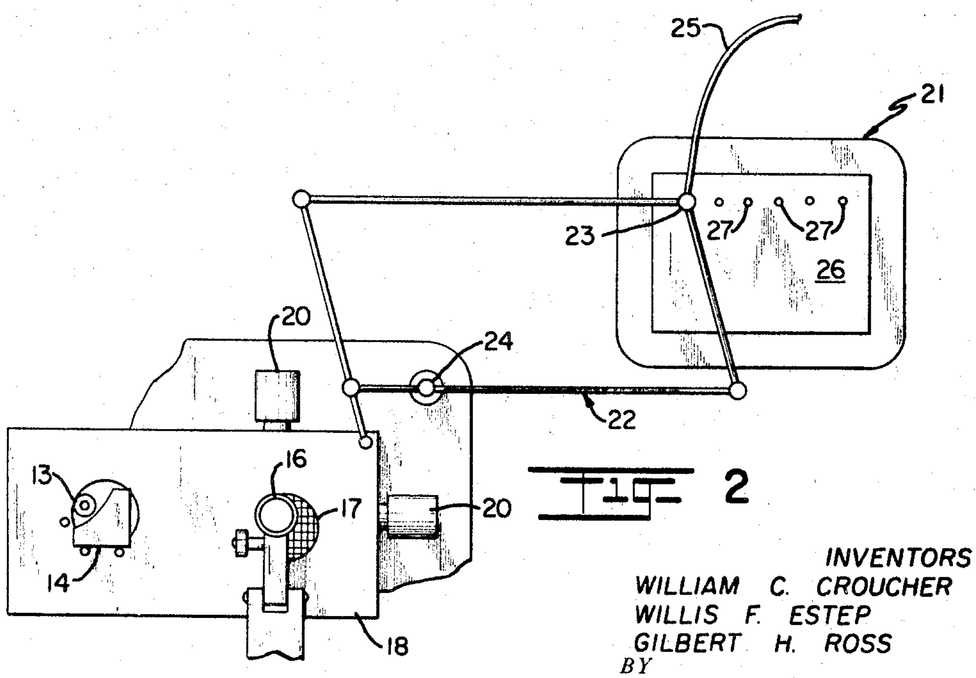

A more detailed description of a specific embodiment of the invention is given below with reference to the accompanying drawings, wherein:

FIGURE 1 is a schematic elevational view showing apparatus of the invention employed for matching registration and reduction of stepped photographic images from a replica to a mask for us on existing patterns on semiconductor wafers or substrates; and FIGURE 2 is a schematic plan view showing apparatus of the invention including position indicating and recording means.

The art work 10, consisting of an array of a large number of systematically arranged microcircuit patterns to be stepped off, is placed upon a transparent copy board 11. Board 11 is illuminated from below by a monochromatic light source 12. Light from source 12 passes through the lens 13. The image of art work 10 is focused on the emulsion of the photographic plate 14. The desired degree of reduction in size of art work 10 is attained by properly setting the distance between the art work and the lens 13. The desired focus of the image on plate 14 is achieved by adjusting the distance between lens 13 and plate 14. This focus initially is optimized with the aid of microscopic observation using microscope 16 as indicated in phantom at 15, of the small reduced image upon a smoked glass plate (not shown), which is subsequently replaced by photographic plate 14. After the camera is lined up and focused in this manner, the stepped photographic repeating operation is initiated.

A silica wafer or an exact-size replica 17 of the array of microcircuit patterns to be copied upon plate 14 is mounted upon the micrometer stage 18 adjacent plate 14 mounted on the camera axis and on stage 18, as shown. With microscope 16 in the follower position indicated at 19, having its target reticule lined up with a discrete reference point of an image of the first microcircuit pattern on a replica or wafer 17, photographic plate 14 is exposed to light from light source 12 to produce a latent photographic image in the emulsion of plate 14.

Micrometer stage 18 then is indexed or stepped, under microscope 16, by suitably turning stage manipulator knobs 20, until the identical reference point of the image of the second microcircuit pattern on wafer or replica 17 is lined up under the reticule of microscope 16. Photographic plate 14 is again exposed as in the first instance. This indexing, or stepping, and exposing sequence is repeated continuously until all of the images of the large number of microcircuit patterns to be copied have been precisely translated to the emulsion of photographic plate 14 as latent images. Standard photographic processing then is used to develop plate 14.

It will be understood that although the method and apparatus of the invention was described above with reference to manual operation, including manual observation and manual indexing or stepping, the method and apparatus can be made to operate automatically, without exercising more than the ordinary skill of the art. For example, microscope 16, when in the follower position indicated at 19, is made to feed an optical pulse into a light sensitive cell or photo cell, which triggers the mechanism or shutter for exposure of phtographic plate 14. The indexing or stepping of micrometer stage 18 is accomplished by the use of a motor drive and a suitable switching mechanism.

It will be seen from the description of the invention given hereinabove, that by the use of the described method and apparatus, new image patterns of microcircuits can be produced from an existing pattern array with a maximum of accuracy and precision and assurance of registration between patterns of the prepared mask and those prediffused or formed in the semiconductor wafer or substrate, as required for making integrated circuit or microcircuit groups of units for dicing to produce the circuit units.

Cumulative dimensional errors and machine tolerances are not encountered when using the method and apparatus of the invention. Lens distortion problems, such as those encountered when the stepping operation is accomplished with the aid of enlarged master grid patterns, are not encountered when using the method of the invention. As the method and apparatus of the invention can be adjusted for any increment of reduction, intermediate photographic reductions do not have to be accurately controlled. Final reductions in the stepping operation can be preadjusted so that the image produced on plate 14 accurately matches the size of the image on the wafer or replica 17.

During the manual operation of the method and apparatus of the invention described hereinabove, the operator normally keeps track of the number and location of the stepped or indexed exposures produced upon plate 14 by counting the discrete reference points lined up and exposed, as described, with reference to wafer or replica 17. Relatively rapid location on wafer or replica 17 is not possible because the replica, or wafer pattern, must be viewed in focus and the reference points sighted with the aid of the high powered, small field microscope objective of microscope 16. Thus, it is important to record the number and location of exposures taken so that the operator can find his place, especially when interruptions occur in the photographing sequence. For this purpose, the *x–y* position indicating and recording means shown in FIGURE 2 has been combined with the match stepping apparatus shown in FIGURE 1. This combination is accomplished by mechanically linking micrometer stage 18 to a recorder 21 through a pantograph 22. As micrometer stage 18 is manipulated by turning knobs 20 to accomplish the step-matching operation of the camera, as described hereinabove, the movement of stage 18 produces a proportional corresponding movement of a marker point 23 through the action of pantograph 22 pivotally mounted at a fixed point 24.

Marker point 23 is electrically actuated by the operator through an electrical cable 25 connected to a source of power (not shown) at a time just after an exposure has been made on photographic plate 14. Marker point 23 produces an *x–y* oriented mark on the chart paper 26 supported on recorder 21. As each exposure is produced on plate 14 an oriented mark 27 is recorded on paper 26 so that the operator at all times can tell immediately, by cursory inspection of marks 27 on paper 26, exactly how far the step-matching operation has progressed for a particular replica 17 and plate 14.

A suitable electrical linkage can be employed between micrometer stage 18 and recorder 21 instead of the pantograph 22, as will be apparent to a person skilled in the art.

Alternatively, marker point 23 can be actuated at the time of making each exposure of plate 14 through an electrical connection with light source 12 (FIGURE 1) and a common power supply.

In addition, the *x–y* oriented marking and recording operation can be accomplished by using a suitable *x–y* position sensing element fastened to micrometer stage 18 to send signals, through an amplifier or servo, to a commercially available *x–y* plotter.

Obviously, many other modifications and variations of the match stepping method and apparatus of the present invention are possible in the light of the teachings given hereinabove. It is therefore, to be understood that, within the scope of the appended claims, the invention can be practiced otherwise than as specifically described.

What is claimed is:

1. A method for making a high resolution photographic plate for producing a mask of the type used in vapor deposition processes in connection with the formation of multiple microcircuit patterns in a predetermined array upon an undiced semiconductor substrate which comprises the steps of: positioning a high resolution photographic plate upon a micrometer stage; positioning an array of multiple microcircuit patterns upon the micrometer stage in spaced relationship with respect to the high resolution photographic plate; mounting a microscope above said array in focused relationship therewith, mounting art work of the microcircuit pattern for projection thereof upon the high resolution photographic plate; mounting a camera lens intermediate the art work and the high resolution photographic plate for projection upon the emulsion of the plate a focused image of the art work of desired size; sequentially aligning the reticule of the microscope with a predetermined reference point of each of the multiple microcircuit patterns of the array; sequentially exposing the high resolution photographic plate to a corresponding image of the respective microcircuit pattern of the art work to produce a latent photographic image in the emulsion of the plate; sequentially stepping the micrometer stage under the microscope until the next adjoining reference point of the next microcircuit pattern of the array is aligned with the reticule of the microscope; continuously repeating the sequence of steps of aligning, exposing and stepping until the array of microcircuit patterns of the art work has been exposed to the plate; and photographic process developing the plate to produce a developed plate image for use in making a desired vapor deposition mask.

2. The method according to claim 1, wherein an *x–y* oriented mask is sequentially recorded on a chart as each of said sequential exposures of said plate is made for showing the degree of progress of the sequential stepwise aligning, exposing and stepping operations.

3. Apparatus for making a high resolution photographic plate for producing a mask of the type used in vapor deposition processes in connection with the formation of multiple microcircuit patterns in a predetermined array upon an undiced semiconductor substrate which comprises: micrometer stage means; high resolution photographic plate means mounted on the stage means; an array of multiple microcircuit patterns mounted on the stage means in spaced relationship with respect to the plate means; microscope means mounted above the array in focused relationship therewith; art work of the microcircuit pattern mounted in spaced relationship with the plate means for projection of the patterns of the art work upon the plate means; camera lens means mounted intermediate the art work and the plate means for projection of a focused image of the art work of desired size upon the emulsion of the plate means; adjustment means on the stage means for sequentially aligning the reticule of the microscope with a predetermined reference point of each of the multiple microcircuit patterns on the array; camera means for sequentially exposing the plate means to a corresponding image of the respective microcircuit pattern of the art work to produce a latent photographic image in the emulsion of the plate means; and stepping means for sequentially stepping the micrometer stage means under the microscope means until an adjoining reference point of the next microcircuit pattern of the array is aligned with the reticule of the microscope means.

4. The apparatus according to claim 3, wherein said multiple microcircuit patterns are a replica of the semiconductor substrate patterns.

5. The apparatus according to claim 3, wherein said multiple microcircuit patterns are on the semiconductor substrate.

6. Apparatus according to claim 3, including *x–y* position indicating and recording means coupled with the apparatus of claim 3 for recording the number and relative location of the exposure made at a given period of time of the stepping operation.

7. Apparatus according to claim 4, wherein said *x–y* position indicating and recording means includes a pantograph means linked to said micrometer stage means, marker means mounted on the pantograph means, and recording chart means operatively associated with the marker means for receiving an *x–y* position mark therefrom as each exposure is made.

8. An apparatus for repeatably exposing a high resolution photographic plate to a negative bearing an image by precisely changing the relative positions of the image and plate to space the latent images on the plate according to spacing requirements dictated by a reference comprising means for supporting the negative and plate for precise relative adjustment, reference means having a plurality of indicia references which dictate the actual spacing of the latent images on the plate, adjustable means for sequentially accurately locating each of said indicia references and to effect a precise change in the relative positions of the image and the plate corresponding to the actual adjustment required to locate each indicia reference, and means for exposing the plate to the image at each relative positions of the image and plate.

9. An apparatus as defined in claim 8, wherein said adjustable means includes an indicia reference locating means for locating each indicia reference on said reference means, a common mounting member for said plate and reference means, adjustment means for adjusting said common mounting member to move said reference means and plate simultaneously relative to said indicia reference locating means and said negative, respectively.

10. An apparatus as defined in claim 9, wherein said indicia reference locating means includes a microscope means having a reticule which is aligned with said indicia references by operation of said adjustment means.

11. An apparatus as defined in claim 9, further including recording means operatively connected with said adjustable means for recording the relative positions of the image and plate at each exposure.

12. A method for aligning an image with a photographic sensitive plate for repeated exposure of the plate to the image to form a plurality of latent images thereon in precise spaced relationship dictated by the spacing between indicia references on a reference means comprising the steps of setting the relative positions of a negative bearing the image and the photosensitive plate so that the setting corresponds to a selected first indicia reference exposing the plate to the image to form a first latent image on the plate, changing the relative positions of the negative and plate preparatory to a second exposure by relatively moving the negative and plate an extent necessary to move from the first selected indicia reference to a second indicia reference, again exposing the plate to the image to form a second latent image on the plate, and repeating the changing and exposing steps until the desired number of latent images are formed on the plate.

References Cited

UNITED STATES PATENTS

| | | | |
|---|---|---|---|
| 3,192,844 | 7/1965 | Szasz et al. | 95—73 |
| 3,220,331 | 11/1965 | Evans et al. | 95—73 |
| 3,247,761 | 4/1966 | Herreman et al. | 88—24 |

NORTON ANSHER, *Primary Examiner.*

RICHARD A. WINTERCORN, *Assistant Examiner.*

U.S. Cl. X.R.

95—4.5; 353—22; 355—72, 77